(12) United States Patent
Budde et al.

(10) Patent No.: US 11,889,246 B1
(45) Date of Patent: Jan. 30, 2024

(54) ELECTRONIC DEVICE AND ELECTRONIC SYSTEM THAT RECEIVES AND PROCESSES TELEMETRY INFORMATION

(71) Applicant: Infineon Technologies AG, Neubiberg (DE)

(72) Inventors: Wolfgang Budde, Aachen (DE); Jens de Bock, Wadersloh (DE); Daniel Domes, Ruethen (DE); Andreas Lenniger, Anroechte (DE); Bjoern Rentemeister, Soest (DE); Stefan Hubert Schmies, Arnsberg (DE); Andreas Vetter, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/857,615

(22) Filed: Jul. 5, 2022

(51) Int. Cl.
*H04Q 9/00* (2006.01)

(52) U.S. Cl.
CPC ........... *H04Q 9/00* (2013.01); *H04Q 2209/10* (2013.01); *H04Q 2209/84* (2013.01)

(58) Field of Classification Search
CPC ........... H04Q 2209/00; H04Q 2209/10; H04Q 2209/30; H04Q 2209/40; H04Q 2209/80; H04Q 2209/84; H04Q 2209/826; H04Q 9/00

See application file for complete search history.

(56) References Cited

U.S. PATENT DOCUMENTS

| | | | | |
|---|---|---|---|---|
| 11,474,146 B2* | 10/2022 | Degrenne | ........... | G01R 31/2874 |
| 11,529,887 B2* | 12/2022 | Herring | ..................... | G06N 5/04 |
| 2016/0313191 A1 | 10/2016 | Sundaramoorthy et al. | | |
| 2018/0145503 A1 | 5/2018 | Minagawa | | |
| 2018/0188309 A1 | 7/2018 | Degrenne et al. | | |
| 2018/0372553 A1 | 12/2018 | Ewanchuk et al. | | |
| 2019/0285689 A1* | 9/2019 | Degrenne | ................ | G01K 1/14 |
| 2019/0331729 A1 | 10/2019 | Degrenne et al. | | |
| 2020/0021235 A1 | 1/2020 | Ewanchuk et al. | | |
| 2020/0256912 A1 | 8/2020 | Degrenne et al. | | |

FOREIGN PATENT DOCUMENTS

| | | | | |
|---|---|---|---|---|
| DE | 102014201581 A1 * | 7/2015 | .............. | B60L 53/20 |
| EP | 3382378 A1 | 10/2018 | | |
| EP | 3531146 A1 | 8/2019 | | |
| EP | 3540451 A1 | 9/2019 | | |

(Continued)

*Primary Examiner* — Franklin D Balseca
(74) *Attorney, Agent, or Firm* — Murphy, Bilak & Homiller, PLLC

(57) ABSTRACT

An electronic device includes: an interface configured to receive telemetry information for one or more power semiconductor devices; and a data acquisition and processing unit. The data acquisition and processing unit may be configured to periodically update an estimate of a remaining lifetime of the one or more power semiconductor devices, based on the telemetry information collected during use of the one or more power semiconductor devices and received at the interface. The data acquisition and processing unit may be configured to adjust one or more operating parameters for each of the one or more power semiconductor devices that has reached a predetermined level of degradation as determined by the telemetry information. An electronic system that includes the electronic device is also described.

25 Claims, 8 Drawing Sheets

(56) References Cited

FOREIGN PATENT DOCUMENTS

| EP | 3546964 | A1 |   | 10/2019 |   |   |
|----|---------|----|---|---------|---|---|
| EP | 3598505 | A1 |   | 1/2020  |   |   |
| EP | 3702793 | A1 |   | 9/2020  |   |   |
| EP | 3705900 | A1 |   | 9/2020  |   |   |
| EP | 3839528 | A1 |   | 6/2021  |   |   |
| JP | 2017169145 | A | * | 9/2017 | ............ | H03K 17/00 |
| JP | 2019187030 | A | * | 10/2019 | ............ | H02M 7/48 |
| WO | 2018086666 | A1 |   | 5/2018  |   |   |

* cited by examiner

ELECTRONIC DEVICE AND ELECTRONIC SYSTEM THAT RECEIVES AND PROCESSES TELEMETRY INFORMATION

BACKGROUND

Power electronic devices, implemented as discrete devices or as power modules, are unpredictable in terms of immediate hard (catastrophic) failure or end-of-life failure caused by degradation of electrical and/or mechanical components. Typically, only lifetime curves for safe operating areas and corresponding application notes are available for consideration. The true state of degradation and individual internal physical limits are unknown. Accordingly, power electronic devices are often replaced too early which leads to higher cost, unnecessary interruption of operation, and environmental waste. An indication of actual remaining physical lifetime for power electronic devices in use is not available because the systems inside and around the power electronic devices do not measure the necessary values and calculate the actual remaining physical lifetime. Also, detection of critical circuit conditions is often too slow to prevent system/component failure. Instead, power electronic devices are typically designed with large safety margins and overly cautious operating areas that may not be necessary for 80% or more of the lifetime as long significant component degradation does not occur.

Thus, there is a need for critical condition detection and handling capability for power electronic devices.

SUMMARY

According to an embodiment of an electronic device, the electronic device comprises: an interface configured to receive telemetry information for one or more power semiconductor devices; and a data acquisition and processing unit configured to periodically update an estimate of a remaining lifetime of the one or more power semiconductor devices, based on the telemetry information collected during use of the one or more power semiconductor devices and received at the interface.

According to an embodiment of an electronic system, the electronic system comprises: one or more power semiconductor devices configured to drive one or more loads; a gate driver configured to drive the one or more power semiconductor devices; a controller configured to control the gate driver; one or more sensors configured to provide telemetry information for the one or more power semiconductor devices; and a data acquisition and processing unit configured to periodically update an estimate of a remaining lifetime of the one or more power semiconductor devices, based on the telemetry information collected during use of the one or more power semiconductor devices.

According to another embodiment of an electronic device, the electronic device comprises: an interface configured to receive telemetry information for one or more power semiconductor devices; and a data acquisition and processing unit configured to configured to adjust one or more operating parameters for each of the one or more power semiconductor devices that has reached a predetermined level of degradation as determined by the telemetry information.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
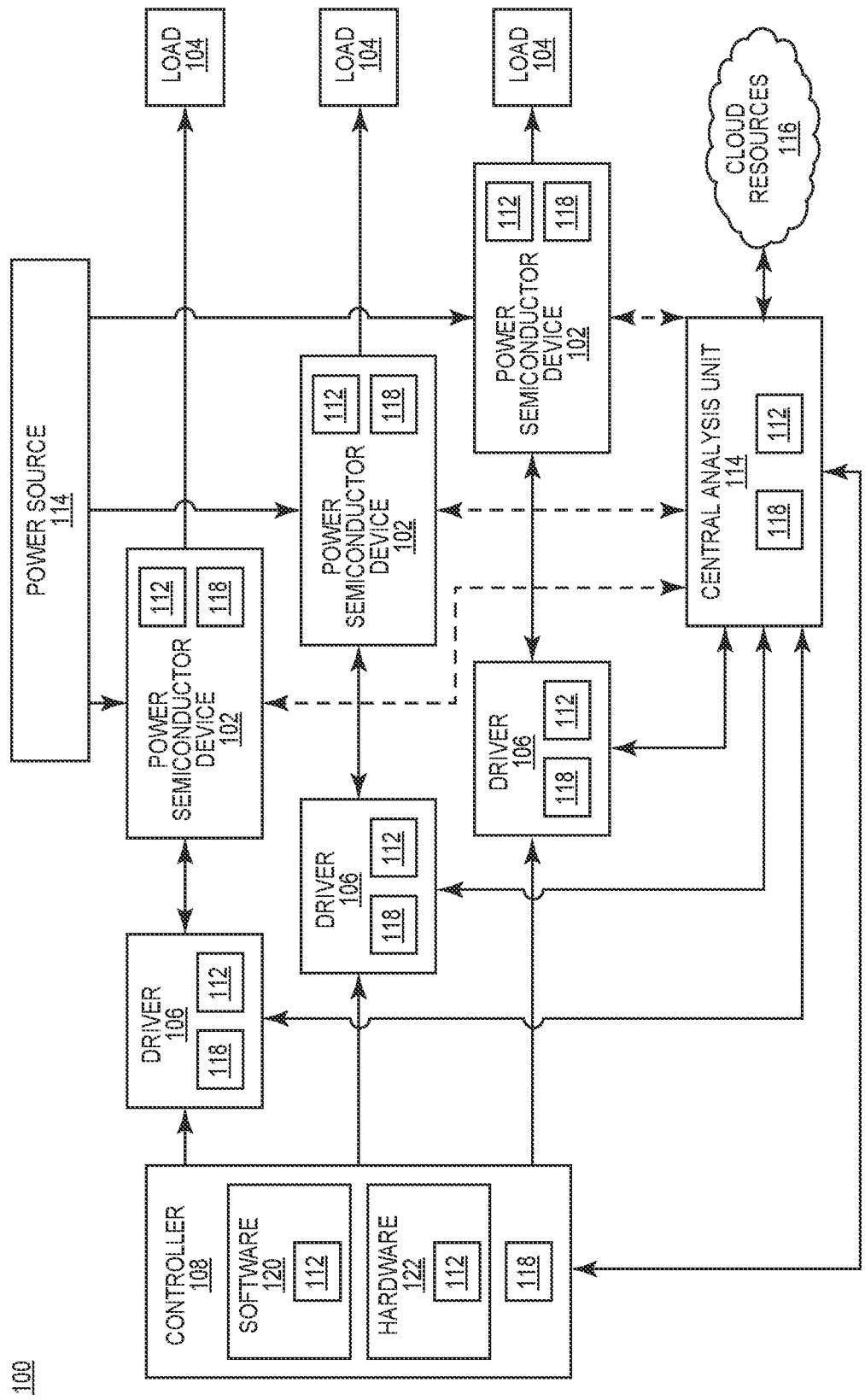
FIG. 1 illustrates a block diagram of an embodiment of an electronic system that includes a data acquisition and processing unit for implementing one or more of critical condition detection and handling capabilities.

The embodiments described herein provide critical condition detection and handling capability for power electronic devices which may be implemented as discrete power devices or as power modules. For example, a power module may include power switches such as IGBTs (insulated-gate bipolar transistors), MOSFETs (metal-oxide-semiconductor field-effect transistors), HEMTs (high-electron mobility transistors), JFETs (junction field-effect transistors), etc., optional free-wheeling diodes and further circuitry, optionally equipped with gate drivers, power supplies, sensors, actuators, control circuitry and algorithms which may be implemented in software/firmware, communication circuitry, and a data acquisition and processing unit that provides critical condition handling capability. In the case of a power module, the components of the power electronic device are integrated in the same module. In the discrete case, the components of the power electronic device are provided as discrete components which may be attached to a system board, for example.

Regardless of the physical power electronic device implementation, the data acquisition and processing unit may be configured to implement condition monitoring, predictive maintenance, process optimization, and/or extra-performance vs. lifetime trade-off. The data acquisition and processing unit may include hardware and/or software for implementing one, more than one but not all, or each of the following capabilities. The data acquisition and processing unit may detect upcoming critical conditions such as short circuit or overload conditions and take action before such a condition becomes critical. The action taken by the data acquisition and processing unit may include limiting the current provided by the power electronic device, limiting the current slew rate, limiting the switching frequency of the power electronic device, and/or setting the power electronic device in a safe state, which may involve at least temporarily turning off the power electronic device.

Separately or in combination, the data acquisition and processing unit may provide user-selectable modes, e.g., as a set of parameters such as maximum efficiency, maximum lifetime, maximum speed, maximum dynamics, minimum EMC (electromagnetic compatibility) to safely operate the power electronic device, etc. The parameters may be predefined as part of the power electronic device design or self-optimized by a technical solution, e.g., using AI (artificial intelligence) algorithms with respect to individual conditions and trends such as lifetime degradation.

Separately or in combination, and if immediate hard (catastrophic) failure is avoided by detecting upcoming critical conditions and acting before such a condition becomes critical, the data acquisition and processing unit may increase the maximum output current so long as an internal temperature of the power electronic device does exceed specified limits. The data acquisition and processing unit may approach or even temporarily exceed the specified physical limits of the power electronic device. In this case, internal measurements of junction temperature or thermal resistance, input/output phase currents, and/or voltages may be used to determine the real physical border of operation, considering even individual device tolerances and actual degradation states. Although higher output power may cause higher stress on the power electronic device which can lead to faster lifetime consumption, such overuse may be beneficial for applications where a trade-off between temporary higher power and overall lifetime is beneficial.

Described next with reference to the figures are embodiments of the critical condition detection and handling capabilities for power electronic devices and power electronic systems that incorporate the power electronic devices.

FIG. 1 illustrates an embodiment of an electronic system 100 such as a DC/AC inverter, a DC/DC converter, an AC/DC converter, a DC/AC converter, an AC/AC converter, a multi-phase inverter, an H-bridge, etc. The electronic system 100 includes one or more power semiconductor devices 102 for driving one or more loads 104, a gate driver 106 for driving the one or more power semiconductor devices 102, a controller 108 for controlling each gate driver 106, and one or more sensors 110 that provide telemetry information about the one or more power semiconductor devices 102. The sensors 110 are not shown in FIG. 1 but are illustrated in other figures.

The telemetry information provided by the sensors 110 may include power device temperature, power device output current, power device output voltage, overcurrent information, undercurrent information, overvoltage information, undervoltage information, etc. The sensors 110 may be included in the power semiconductor devices 102, the gate drivers 106, and/or the controller 108. That is, the sensing capability described herein may be distributed across more than one component type (e.g., the power semiconductor devices 102 and the gate drivers 106) of the electronic system 100 or may be performed by a single component type (e.g., the power semiconductor devices 102 or the gate drivers 106) of the electronic system 100.

The electronic system 100 also includes a data acquisition and processing unit 112 that is configurable to implement one or more of the critical condition detection and handling capabilities described herein. The data acquisition and processing unit 112 may be distributed across more than one component type of the electronic system 100 or may be included in a single component type of the electronic system 100. For example, the data acquisition and processing unit 112 may be distributed across the power semiconductor devices 102 and/or the gate drivers 106 and/or the controller and/or elsewhere such as in a central analysis unit 114 and/or a cloud computing resource 116, where the central analysis unit 114 is separate from the controller 108 and each power semiconductor device 102. Alternatively, the data acquisition and processing unit 112 may be implemented in just the power semiconductor devices 102, just the gate drivers 106, just the controller, just the central analysis unit 114, or just the cloud computing resource 116. In each case, the electronic device that includes all or part of the data acquisition and processing unit 112 has an interface 118 for receiving telemetry information for one or more power semiconductor devices 102 and based upon which the data acquisition and processing unit 112 takes one or more actions.

In one embodiment, and regardless of whether the data acquisition and processing unit 112 is distributed across more than one component type of the electronic system 100 or included in a single component type of the electronic system 100, the data acquisition and processing unit 112 may periodically update an estimate of a remaining lifetime of the one or more power semiconductor devices 102, based on the telemetry information collected during use of the one or more power semiconductor devices 102. Separately or in addition, the data acquisition and processing unit 112 may adjust one or more operating parameters for each power semiconductor devices 102 that has reached a predetermined level of degradation as determined by the telemetry information. Separately or in addition, the data acquisition and processing unit 112 may modify a model used by the data acquisition and processing unit 112 to estimate the remaining lifetime of the one or more power semiconductor devices 102, based on information received from a cloud computing resource 116.

The data acquisition and processing unit 112 may include software 120, e.g., firmware and/or hardware 122 for implementing one or more of the critical condition detection and handling capabilities described herein. The critical condition detection and handling capabilities which can be implemented by the data acquisition and processing unit 112, based on the telemetry information for the one or more power semiconductor devices 102, are described in more detail later herein.

Figure 2:
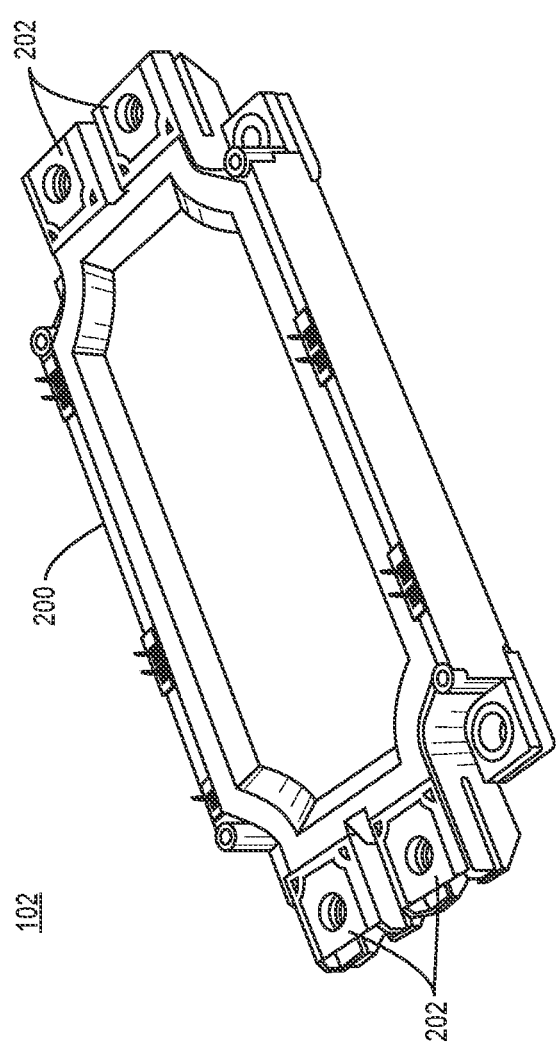
FIG. 2 illustrates a side perspective view of a power module for which the data acquisition and processing unit may implement one or more of critical condition detection and handling capabilities.

As described above, the power electronic devices 102 may be implemented as discrete power devices or as power modules. For example, FIG. 2 shows an example of a power electronic device 102 implemented as a power module 200 which may include power switches such as IGBTs, MOSFETs, HEMTs, JFETs, etc., optional free-wheeling diodes and further circuitry. The power module 200 includes power terminals 202 for inputting power from a power source 114 and outputting power to the corresponding load 104. The power module 200 may optionally include the corresponding gate driver 106, power supplies, some or all of the sensors 110, actuators, control circuitry and algorithms which may be implemented in software/firmware, and communication circuitry. The power module 200 may include part or all of the data acquisition and processing unit 112 that provides one or more of the critical condition handling capabilities described herein. In the power module case, the components of the power electronic device are integrated in the same module.

Figure 3:
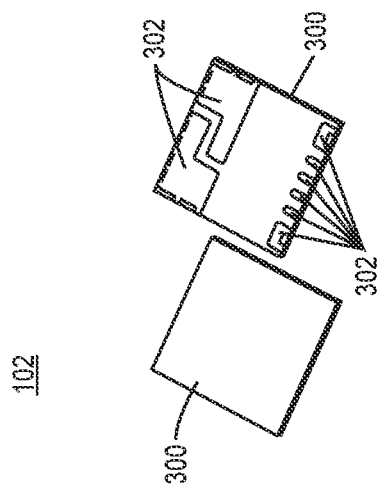
FIG. 3 illustrates front and back perspective views of a discrete power semiconductor die for which the data acquisition and processing unit may implement one or more of critical condition detection and handling capabilities.

In the discrete case, the components of the power electronic device are provided as discrete components which may be attached to a system board, for example. For example, FIG. 3 shows an example of a discrete power semiconductor die 300. The discrete power semiconductor die 300 may be include an IGBT, MOSFET, HEMT, JFET, free-wheeling diode, etc. The discrete power semiconductor die 300 has power and control terminals 302 at one or both sides of the die 300. The discrete power semiconductor die 300 may include part or all of the data acquisition and processing unit 112 that provides one or more of the critical condition handling capabilities described herein.

Figure 4:
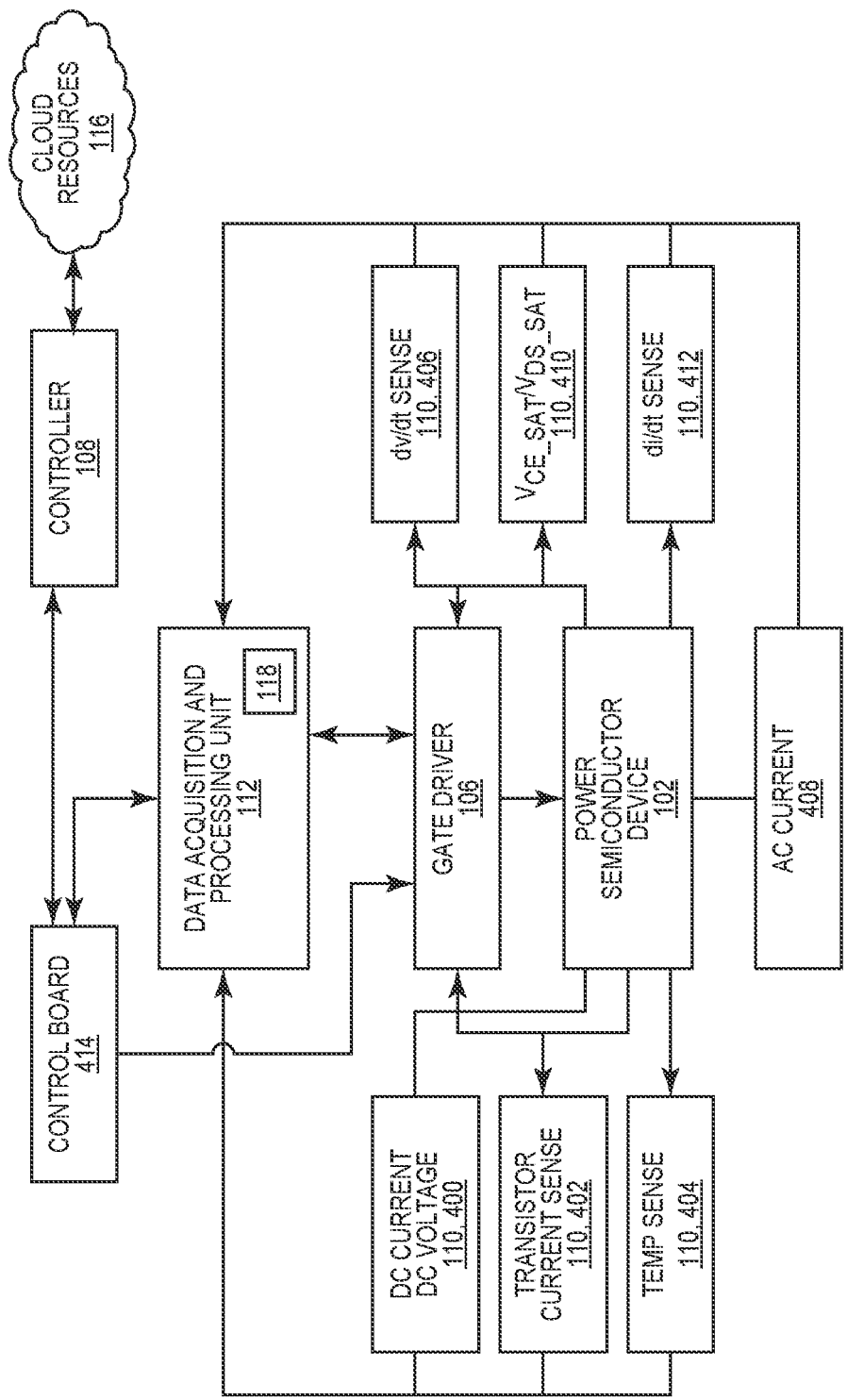
FIG. 4 illustrates a block diagram of another embodiment of an electronic system that includes the data acquisition and processing unit.

FIG. 4 illustrates an embodiment of the sensors 110 that may provide telemetry information about the one or more power semiconductor devices 102 to the data acquisition and processing unit 112. One sensor 400 may sense and report DC input current and/or DC input voltage of each power semiconductor device 102 to the data acquisition and processing unit 112. Another sensor 402 may sense and report individual transistor currents, e.g., individual collector currents of IGBTs or individual drain currents of MOSFETs included in each power semiconductor device 102 to the data acquisition and processing unit 112. Another sensor 404 may sense and report temperature data, e.g., such as junction temperature, thermal resistance, etc. for each power semiconductor device 102 to the data acquisition and processing unit 112. Another sensor 406 may sense and report voltage slew rate (dv/dt) for each power semiconductor device 102 to the data acquisition and processing unit 112, e.g., based on the AC output current 408 of each power semiconductor device 102. Another sensor 410 may sense and report the saturation voltage, e.g., collector-emitter ($V_{CE\_SAT}$) saturation voltage of IGBTs or drain-source ($V_{DS\_SAT}$) saturation voltage of MOSFETs included in each power semiconductor device 102 to the data acquisition and processing unit 112, e.g., based on the AC output current 408 of each power semiconductor device 102. Another sensor 412 may sense and report current slew rate (di/dt) for each power semiconductor device 102 to the data acquisition and processing unit 112, e.g., based on the AC output current 408 of each power semiconductor device 102. Still other types of sensors 110 may be used to provide telemetry information indicative of the operational health and remaining lifetime of the one or more power semiconductor devices 102.

The data acquisition and processing unit 112 uses the telemetry information provided by the one or more sensors 110 to implement one or more of the critical condition detection and handling capabilities described herein. The controller 108, cloud computing resource 116, an entity 414 such as a control board that has dominion over the controller 408, etc. similarly may provide telemetry information to the data acquisition and processing unit 112 for implementing the critical condition detection and handling capabilities described herein and/or additional information that informs the data acquisition and processing unit 112 as to which corrective actions, if any, may be taken in response to the reported telemetry information. The data acquisition and processing unit 112 may communicate with the sensors 110, controller 108, cloud computing resource 116, the entity 414 having dominion over the controller 408, etc. via wired and/or wireless communication channels.

Figure 5:
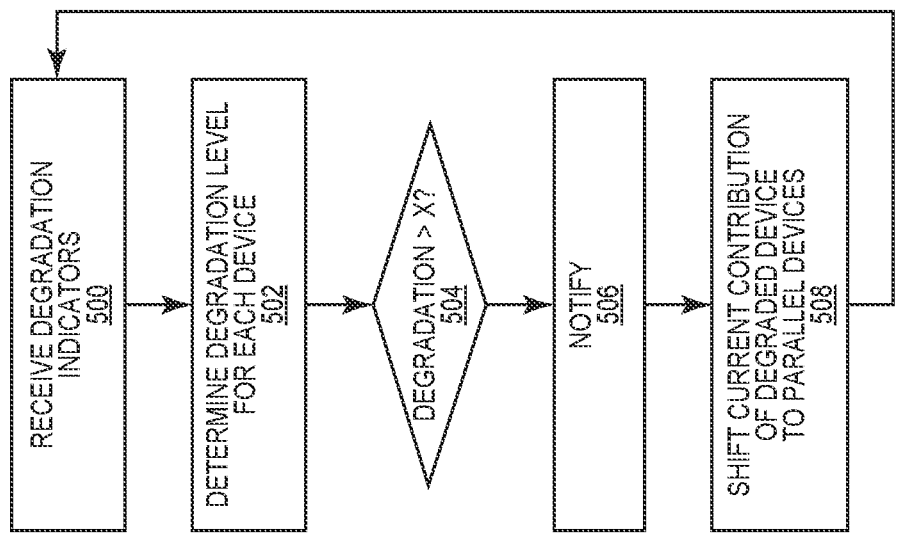

FIG. 5 illustrates an embodiment of a critical condition detection and handling capability for which the data acquisition and processing unit 112 is configured to implement, based on telemetry information received by the interface 118 included in or associated with the data acquisition and processing unit 112. According to this embodiment, the received telemetry information includes one or more indicators of power semiconductor device degradation (Block 500). The data acquisition and processing unit 112 determines whether any of the power semiconductor devices 102 has reached a predetermined level of degradation based on the power semiconductor device degradation information included in the telemetry information. For example, the parameters sensed by the temperature sensor 404, voltage slew rate sensor 406, saturation voltage sensor 410, and current slew rate sensor 412 can indicate power semiconductor device degradation based on changes in the corresponding sensed parameter.

The data acquisition and processing unit 112 determines the degradation level for each power semiconductor device 102, based on the corresponding device degradation information received by the data acquisition and processing unit 112 (Block 502). If at least one power semiconductor device 102 reaches a predetermined level of degradation 'X' (Block 504), the data acquisition and processing unit 112 may notify the controller 108, cloud computing resource 116, the entity 414 having dominion over the controller 408, etc. (Block 506) and shift at least some current away from that power semiconductor device 102 to one or more of the power semiconductor devices 102 that have not reached the predetermined level of degradation X (Block 508). In other words, the data acquisition and processing unit 112 may intentionally force a current imbalance between the power semiconductor devices 102 when at least one power semiconductor device 102 reaches the predetermined level of degradation X. Accordingly, a lower load current burden is placed on each power semiconductor device 102 that reaches the predetermined level of degradation X and a higher load current burden is placed on one or more of the power semiconductor devices 102 that have not reached the predetermined level of degradation X. The current imbalance may be permitted to continue, e.g., until each power semiconductor device 102 that reached the predetermined level of degradation X is replaced. The controller 108 may instead implement the algorithm illustrated in FIG. 5, or the data acquisition and processing unit 112 may perform part of the algorithm and the controller 108 may perform another part of the algorithm.

Figure 6:
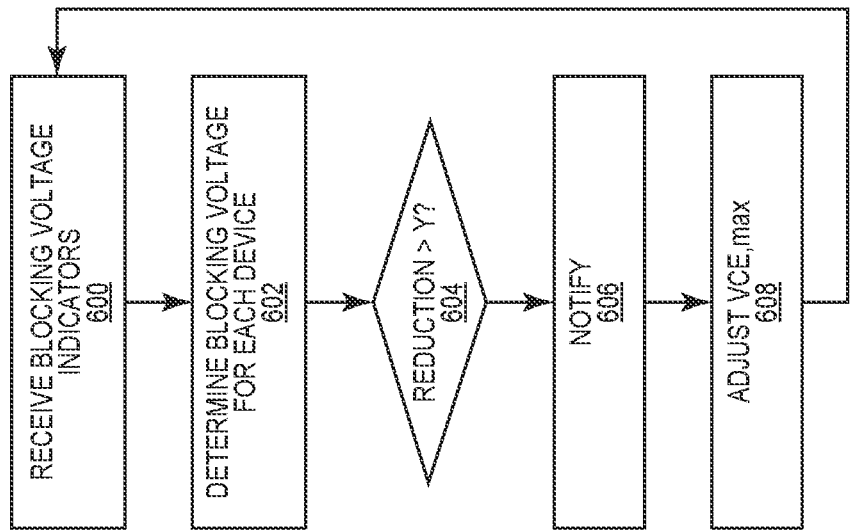
FIGS. 5 through 10 each illustrate a flow diagram of an embodiment of a critical condition detection and handling capability implemented by the data acquisition and processing unit.

FIG. 6 illustrates another embodiment of a critical condition detection and handling capability for which the data acquisition and processing unit 112 is configured to implement, based on telemetry information received by the interface 118 included in or associated with the data acquisition and processing unit 112. According to this embodiment, the received telemetry information includes one or more indicators of blocking voltage capability for the one or more power semiconductor devices 102 (Block 600). The data acquisition and processing unit 112 determines whether the blocking voltage capability of any of the one or more power semiconductor devices 102 has dropped below a predetermined level based on the one or more indicators of blocking voltage capability included in the telemetry information. For example, the parameters sensed by the transistor current sensor 402 and the saturation voltage sensor 410 can indicate reduction in blocking voltage capability based on changes in the corresponding sensed parameter.

The data acquisition and processing unit 112 determines the blocking voltage for each power semiconductor device 102, based on the corresponding blocking voltage capability information received by the data acquisition and processing unit 112 (Block 602). If the blocking voltage capability of at least one power semiconductor device 102 has dropped below a predetermined level 'Y' (Block 604), the data acquisition and processing unit 112 may notify the controller 108, cloud computing resource 116, the entity 414 having dominion over the controller 408, etc. (Block 606) and adjust the maximum allowed saturation voltage $V_{CE\_SAT}$/$V_{DS\_SAT}$ for each power semiconductor device 102 having a reduced blocking voltage capability (Block 608). For example, the data acquisition and processing unit 112 may lower the permitted current slew rate di/dt for each power semiconductor device 102 having a blocking voltage capability that dropped below the predetermined level Y.

By reducing the switching slope (di/dt), induced voltages in any stray inductances are lower which in turn reduces leakage current. Separately or in combination, the controller 108 and/or the data acquisition and processing unit 112 may adjust the control of the gate driver 106 for each power semiconductor device 102 having a blocking voltage capability that dropped below the predetermined level Y. The controller 108 may instead implement the algorithm illustrated in FIG. 6, or the data acquisition and processing unit 112 may perform part of the algorithm and the controller 108 may perform another part of the algorithm.

Figure 7:
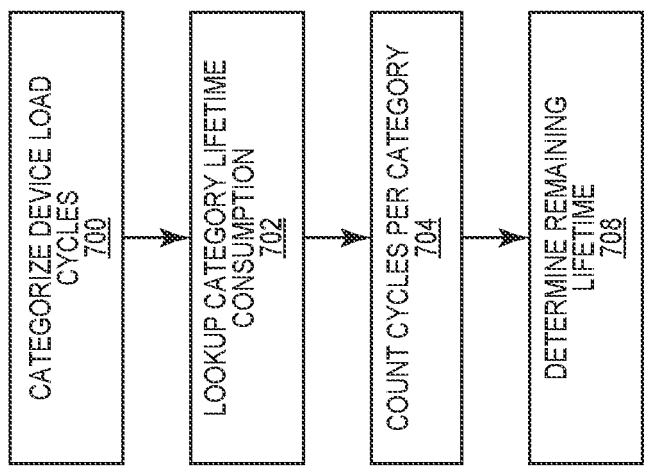

FIG. 7 illustrates another embodiment of a critical condition detection and handling capability for which the data acquisition and processing unit 112 is configured to implement, based on telemetry information received by the interface 118 included in or associated with the data acquisition and processing unit 112. According to this embodiment, the data acquisition and processing unit 112 stores a plurality of operating mode profiles for the one or more power semiconductor devices 102 and updates one or more of the operating mode profiles based on the received telemetry information and/or based on information received from a cloud computing resource 116. The data acquisition and processing unit 112 may report each updated operating mode profile to the controller 108 and/or the entity 414 having dominion over the controller 108.

For example, the data acquisition and processing unit 112 may categorize different types of load cycles (e.g., full load, partial load, low power, etc.) for each power semiconductor device 102 (Block 700). The data acquisition and processing unit 112 may perform a lookup of each lifetime consumption category (Block 702) and counts load cycles per category for each power semiconductor device 102 (Block 704). With this information (total cycles per category per device), the data acquisition and processing unit 112 may determine the remaining lifetime of each power semiconductor device 102 (Block 706) and the data acquisition and processing unit 112 may report the most recent estimate of the remaining lifetime of each power semiconductor device 102 to the controller 108 and/or to the entity 414 having dominion over the controller 108.

The electronic system 100 may be operated on a predetermined maintenance schedule and each power semiconductor device 102 is replaced or serviced at the end of its calculated life. However, some power semiconductor devices 102 may fail earlier than predicted when first put into service. The data acquisition and processing unit 112 may include one or more algorithms, e.g., as shown in FIG. 7, that utilize each power semiconductor device 102 just up to the last moment before unexpected early failure (e.g., days or weeks). Any power semiconductor device 102 that is expected to imminently fail earlier than predicted when first put into service, is replaced or serviced to maximize device usage without sacrificing safety protection against unexpected end-of-life failures.

In another embodiment, the data acquisition and processing unit 112 calculates a running total of operating cycles for each power semiconductor device 102 based on the received telemetry information. The data acquisition and processing unit 112 periodically updates the estimate of the remaining lifetime of each power semiconductor device 102 based on the running total of operating cycles. The controller 108 may instead implement the algorithm illustrated in FIG. 7, or the data acquisition and processing unit 112 may perform part of the algorithm and the controller 108 may perform another part of the algorithm.

Separately or in combination, the controller 108 and/or the data acquisition and processing unit 112 may adjust the control of each gate driver 106 based on the estimate of the remaining lifetime of the corresponding power semiconductor device 102. For example, the data acquisition and processing unit 112 may report the most recent estimate of the remaining lifetime of each power semiconductor device 102 to the controller 108 and the controller 108 may adjust the control of each gate driver 106 based on the most recent estimate of the remaining lifetime reported by the data acquisition and processing unit 112. Separately or in combination, the data acquisition and processing unit 112 may modify a model used by the data acquisition and processing unit 112 to estimate the remaining lifetime of each power semiconductor device 102, based on information received from a cloud computing resource 116.

Figure 8:
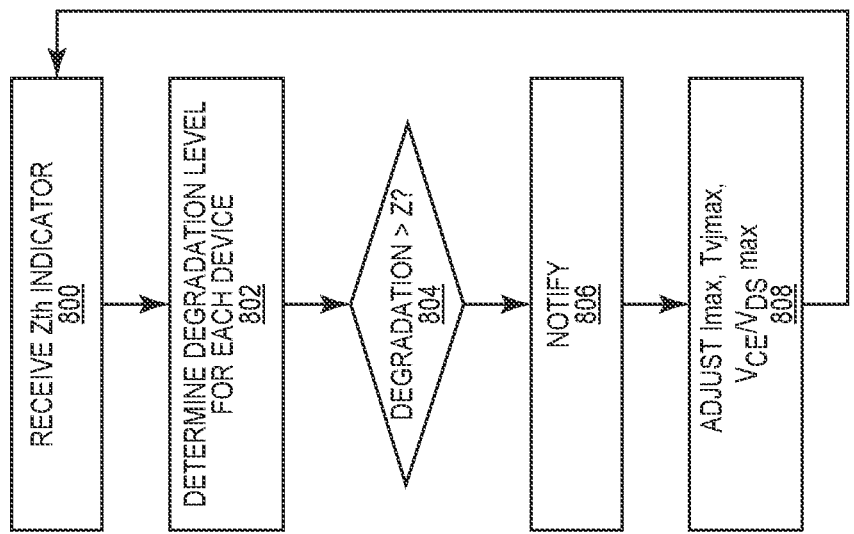

FIG. 8 illustrates another embodiment of a critical condition detection and handling capability for which the data acquisition and processing unit 112 is configured to implement, based on telemetry information received by the interface 118 included in or associated with the data acquisition and processing unit 112. According to this embodiment, the received telemetry information includes thermal resistance information for the one or more power semiconductor devices 102 (Block 800). The data acquisition and processing unit 112 determines whether any of the power semiconductor devices 102 has reached a predetermined level of degradation based on the thermal resistance information included in the telemetry information. For example, thermal resistance information for each power semiconductor device 102 may be provided by the temperature sensors 404.

The data acquisition and processing unit 112 determines the degradation level for each power semiconductor device 102, based on the corresponding thermal resistance information received by the data acquisition and processing unit 112 (Block 802). If at least one power semiconductor device 102 reaches a predetermined level of thermal resistance degradation 'Z' (Block 504), the data acquisition and processing unit 112 may notify the controller 108, cloud computing resource 116, the entity 414 having dominion over the controller 408, etc. (Block 806) and adjust the permitted maximum current 'Imax' and/or the permitted maximum junction temperature 'Tvjmax' and/or the permitted maximum voltage '$V_{CE}/V_{DS}$ max' for each power semiconductor device 102 that has reached the predetermined level of thermal resistance degradation Z (Block 808). If thermal resistance of a power semiconductor device 102 increases over time, that power semiconductor device 102 cannot drive the load 104 as hard as in the beginning of the life of the device 102. Reducing Imax, Tvjmax, and/or $V_{CE}/V_{DS}$ max enables continued use of the affected power semiconductor device 102. The data acquisition and processing unit 112 may calculate the remaining lifetime of the affected power semiconductor device 102 based on actual measurement and/or use data, e.g., as previously described herein in connection with FIG. 7. The controller 108 may instead implement the algorithm illustrated in FIG. 8, or the data acquisition and processing unit 112 may perform part of the algorithm and the controller 108 may perform another part of the algorithm.

Figure 9:
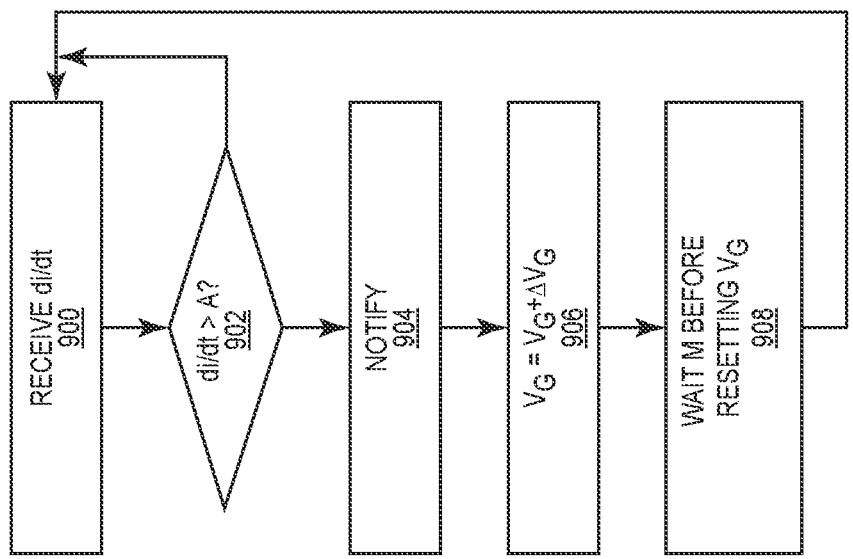

FIG. 9 illustrates another embodiment of a critical condition detection and handling capability for which the data acquisition and processing unit 112 is configured to implement, based on telemetry information received by the interface 118 included in or associated with the data acquisition and processing unit 112. According to this embodiment, the received telemetry information includes current slew rate information 'di/dt' for each power semiconductor device 102 (Block 800). The data acquisition and processing unit 112 adjusts one or more operating parameters for each power semiconductor device 102 that has reached a predetermined level 'A' of degradation as determined by the current slew rate information included in the telemetry information. For example, current slew rate information for each power semiconductor device 102 may be provided by sensors 412 shown in FIG. 4.

Current slew rate is predictive of early short circuit conditions when current suddenly and rapidly increases. If the current slew rate information for at least one power semiconductor device 102 exceeds a predetermined limit 'A' (Block 902), the data acquisition and processing unit 112 may notify the controller 108, cloud computing resource 116, the entity 414 having dominion over the controller 408, etc. (Block 904) and increase the gate voltage $V_G$ by an amount $\Delta V_G$ such that the adjusted gate voltage exceeds a maximum permitted level (Block 906). The data acquisition and processing unit 112 waits a predetermined amount of time 'M' (Block 908) and then reassess based on new current slew rate information (Blocks 900 through 906). The controller 108 may instead implement the algorithm illustrated in FIG. 9, or the data acquisition and processing unit 112 may perform part of the algorithm and the controller 108 may perform another part of the algorithm.

Figure 10:
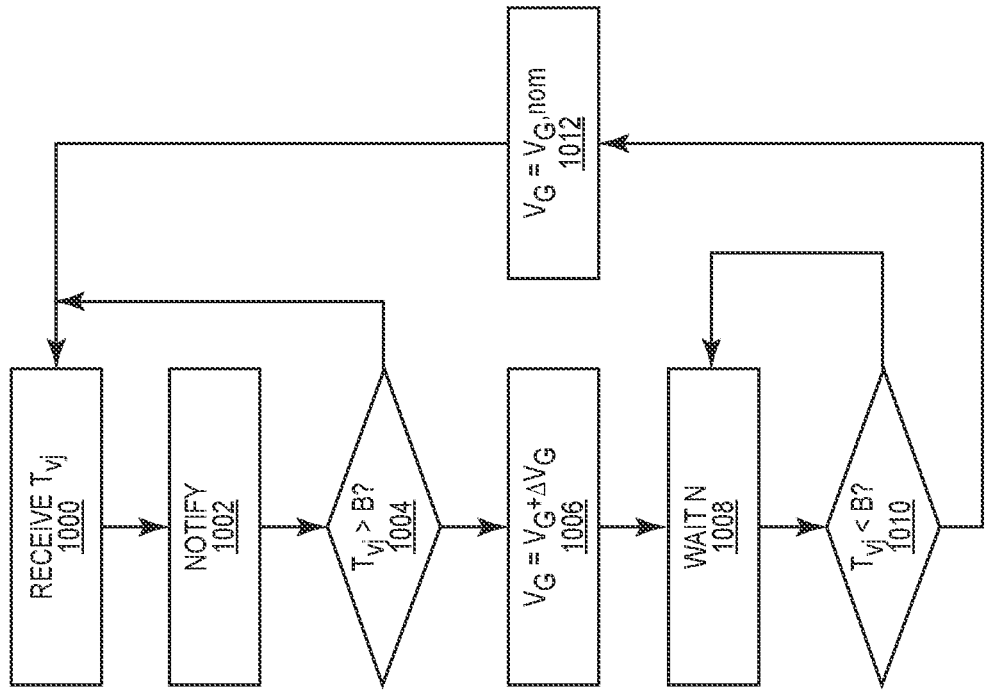

FIG. 10 illustrates another embodiment of a critical condition detection and handling capability for which the data acquisition and processing unit 112 is configured to implement, based on telemetry information received by the interface 118 included in or associated with the data acquisition and processing unit 112. According to this embodiment, the received telemetry information includes junction temperature information 'Tvj' for each power semiconductor device 102 (Block 1000). For example, junction temperature information for each power semiconductor device 102 may be provided by the temperature sensors 404 shown in FIG. 4. The data acquisition and processing unit 112 may notify the controller 108, cloud computing resource 116, the entity 414 having dominion over the controller 408, etc. about the received junction temperature information Tvj (Block 1002).

If the junction temperature information Tvj for at least one power semiconductor device 102 exceeds a predetermined limit 'B' (Block 1004), the data acquisition and processing unit 112 increases the gate voltage $V_G$ by an amount $\Delta V_G$ such that the adjusted gate voltage exceeds a maximum permitted level (Block 1006). Increasing the gate voltage $V_G$ of a power semiconductor device 102 reduces switching losses for that device 102, but leaves the power semiconductor device 102 more susceptible to short circuit conditions.

To reduce susceptibility to short circuit conditions, the data acquisition and processing unit 112 waits a predetermined amount of time 'N' (Block 1008) and then reassess whether newly received junction temperature information Tvj for the same power semiconductor device 102 has dropped below the predetermined limit B (Block 1004). If not, the data acquisition and processing unit 112 again waits the predetermined amount of time N (Block 1008) and rechecks each time new junction temperature information Tvj becomes available (Block 1010). If newly received junction temperature information Tvj for the power semiconductor device 102 is below the predetermined limit B, the data acquisition and processing unit 112 returns the gate voltage $V_G$ to a nominal value $V_{G,nom}$ below the maximum permitted level to reduce short circuit susceptibility (Block 1012). The controller 108 may instead implement the algorithm illustrated in FIG. 10, or the data acquisition and processing unit 112 may perform part of the algorithm and the controller 108 may perform another part of the algorithm.

Figure 11:
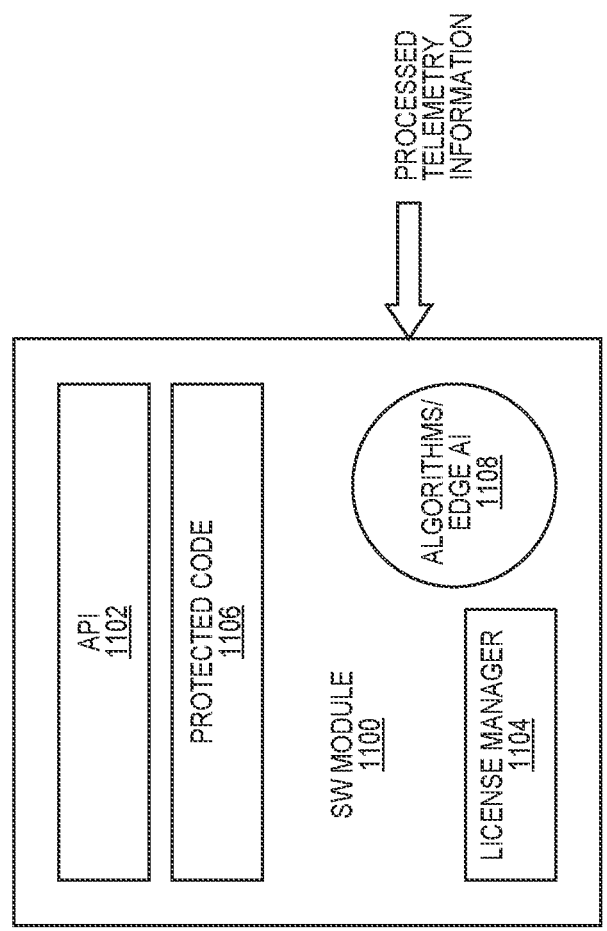
FIG. 11 illustrates an embodiment of a software module component of the data acquisition and processing unit.

As explained above, the data acquisition and processing unit 112 may include software 120, e.g., firmware and/or hardware 122 for implementing one or more of the critical condition detection and handling capabilities described herein. FIG. 11 illustrates an embodiment of a software (SW) module 1100 component of the data acquisition and processing unit 112. The software module 1100 may include an application program interface (API) 1102 that allows communication with another software module or program, a license manager 1104 to prevent unauthorized access, protected code 1106 which limits unauthorized analysis, and algorithms and/or Edge AI 1108 for implementing any of the critical condition detection and handling capabilities herein based on processed telemetry information about the semiconductor devices 102 included in the electronic system. Edge AI enables deployment of any of the critical condition detection and handling capabilities herein to remotely located devices using cloud computing resources 116.

Figure 12:
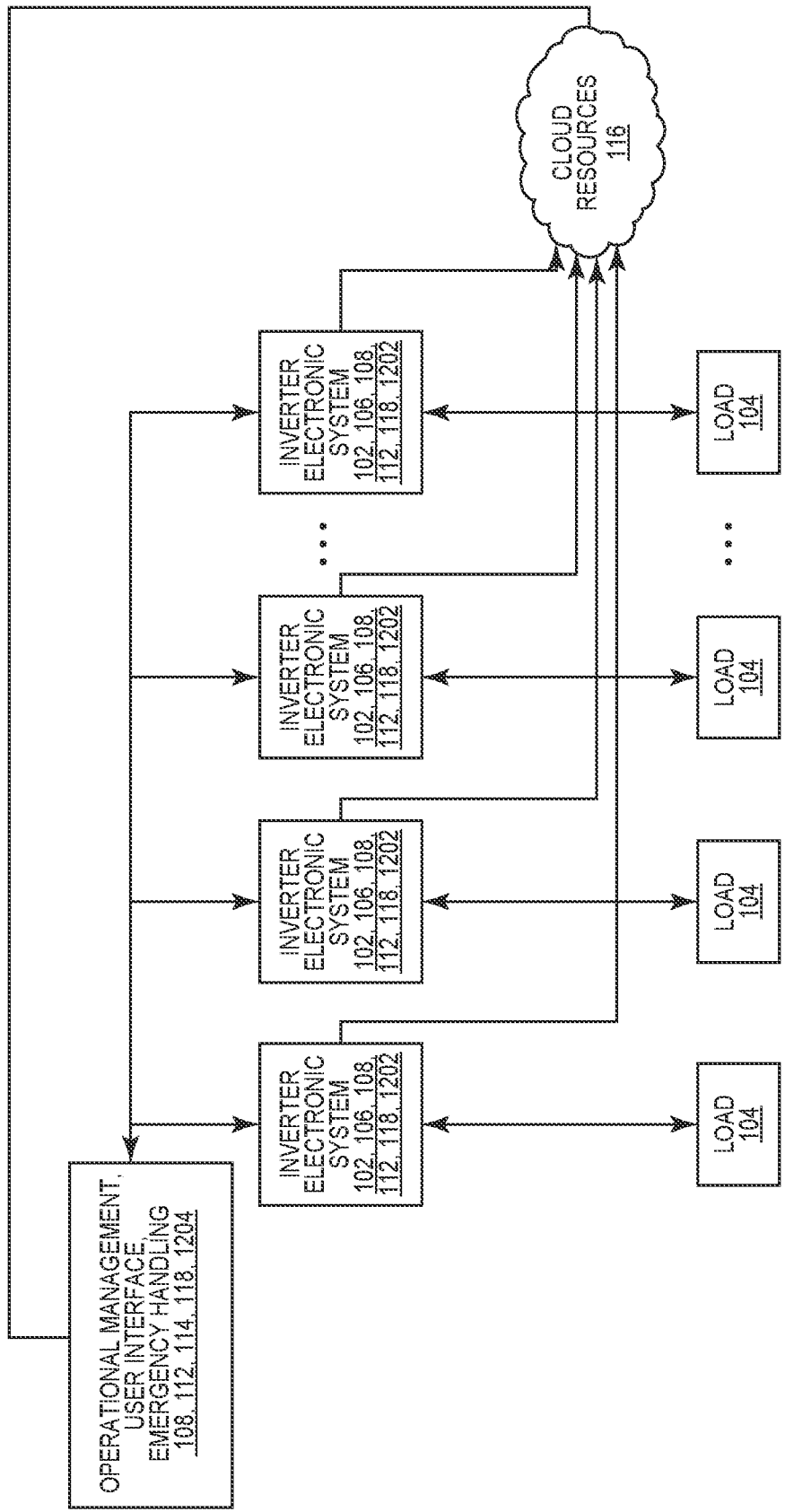
FIG. 12 illustrates a block diagram of another embodiment of an electronic system that includes the data acquisition and processing unit.

FIG. 12 illustrates another embodiment of an electronic system 1200, where each power semiconductor device 102 forms an inverter system 1202. According to this embodiment, the functionality of the central analysis unit 114 is integrated into a system 1204 that provides operational management, user interface, and emergency handling capability for the electronic system 1200. The functionality of the gate drivers 106, controller 108, data acquisition and processing unit 112, and telemetry interface 118 may be integrated in each inverter system 1202.

The data acquisition and processing unit 112 may be distributed across more than one component type of the electronic system 120 or may be included in a single component type of the electronic system 120. For example, the data acquisition and processing unit 112 may be distributed across the inverter systems 1202 and/or the system 1204 that provides operational management, user interface, and emergency handling capability and/or a cloud computing resource 116. For example, some analysis may be done locally within the central analysis system 114 where certain parameters may be extracted from the measured telemetry data and local action taken, e.g., within an analysis unit by reprogramming drivers 106 or by instructing the inverter controller 108. Other analysis may be done in by cloud computing resources 116, e.g., temperature may be stored for every power semiconductor device 102 and analyzed over years.

The cloud computing resources 116 may perform long term analysis to track trends over months or even years, and provide feedback to the inverter systems 1202 and direct the inverter systems 1202 to operate the respective power semiconductor devices 102 differently. Measurements may be enriched by providing some of the telemetry data to an edge device such as the central analysis unit 114, and cloud connectivity may be provided for cloud-based learning to make power semiconductor device design more accurate to improve lifetime prediction capability. For example, the central analysis unit 114 may have a power semiconductor device model that predicts remaining lifetime of each power semiconductor device 102 based on parameter inputs. A lifetime prediction model used by the central analysis unit 114 could be improved over time based on cloud learning. Data may come from related/similar devices, e.g., from a characterization environment. Measurements may be take real-time by the sensors 110 during actual use to update a model or take further action. Some processing may be done in the field and other processing may be done in the 'cloud' by cloud computing resources 116.

The embodiments described herein enable power semiconductor devices with power transistor switches, diodes and related power electronics devices, with the following additional functions: (1) built-in short circuit detection and emergency shut down, e.g., via a slow down or current limiter which may be a passive or an active gate control unit, e.g., as part of the gate driver; (2) built-in current and voltage measurements on all phases that is accurate enough to determine any upcoming critical event such as a short circuit and/or overvoltage, thus avoid device destruction, e.g., in case of an external overcurrent event, the affected phase may operate like a constant current source instead of latching turn off; (3) built-in junction temperature measurement, e.g., using in/on-chip sensors that is accurate, close, and fast enough to determine the real temperature of temperature-sensitive components such as MOSFETs, IGBTs, diodes, etc.; (4) the measured telemetry parameters may be used to monitor, process, characterize, and/or count every single switching cycle/event and track such occurrences to provide a realistic lifetime indicator; (5) the measured telemetry parameters may be used to determine individual device tolerances and degradation state over the lifetime such that the remaining lifetime of each individual device may be estimated; (6) different device parameter pre-sets to operate a power semiconductor device in different modes may be stored in the device and offered to a customer for individual and situational choice; (7) the measured telemetry parameters may be dynamic and adapted by a desired technical solution depending on individual conditions, trends, and degradation of an individual power semiconductor device and possibly other system components; (8) each power semiconductor device may be operated to the highest possible lifetime with a predictable controlled failure at the end of the life of the device; (9) a mode may enable the maximum output power under current situation approaching physical device limits where such physical limits may be expressed as combinations of junction temperature, currents, voltages, and other relevant parameters, and may be enabled only as much as a particular condition of the system and the particular power semiconductor device allows; (10) some of these modes may self-activate autonomously to ensure safe end-of-life management and/or maximum energy efficiency, and may cover other system component degradation such as a DC link, to provide safe system downsizing as device degradation occurs; (11) new or different load and switching profiles may be estimated based on past data, and future power device behavior in the system may be predicted; (12) specific recommendations may be proposed to the final customer for further operating the system regarding technical or financial optimization; (13) a technical dashboard or messenger service may be used to display precise advice to the final customer for maintenance, system setup, repair, or other necessary interactions, to ensure a granted operation and no or limited unscheduled downtime of the application; (14) series measurements results may be made available (e.g., stored) in the data acquisition and processing unit and/or externally and may influence AI for lifetime prediction, safe operating areas, parameter pre-sets, etc.; (15) measured telemetry data may be analyzed and characteristic features representing device stress factors may be extracted, with the characteristic features being used to determine actual 'consumed' life of a power semiconductor device; (16) part of the additional functionality (e.g., sensing, analysis etc.) may be embedded into the power semiconductor devices, attached to the power semiconductor devices, and/or located in a separate device in the vicinity of the power semiconductor devices; (17) part of the analysis functionality (e.g., algorithms) may be implemented as software which is licensed to a user of a power semiconductor device, e.g. an inverter manufacturer, and the software may be embedded into the control code of the inverter, may be supplied with measurement data from a power semiconductor device, and may provide, via an API, dedicated analysis information (e.g., under an appropriate usage contract); (18) communication of sensor data, analysis results, usage recommendations etc. may be done using dedicated connectors, e.g., by modulating signals on existing interfaces (e.g., power and gate terminals) or by contactless communications (e.g., RF, optical, capacitive, inductive, etc.); (19) measured telemetry data may be stored as raw or compressed data in a safe storage device for subsequent analysis, and the storage may be done in a cyclic buffer to limit the required storage space; (20) measured telemetry data may not only be used to determine the state of health of a power semiconductor device but also to provide insight into the overall system state-of-health (e.g. DC link capacitors in an inverter, mechanical elements linked to a motor drive, etc.).

Although the present disclosure is not so limited, the following numbered examples demonstrate one or more aspects of the disclosure.

Example 1. An electronic device, comprising: an interface configured to receive telemetry information for one or more power semiconductor devices; and a data acquisition and processing unit configured to periodically update an estimate of a remaining lifetime of the one or more power semiconductor devices, based on the telemetry information collected during use of the one or more power semiconductor devices and received at the interface.

Example 2. The electronic device of example 1, wherein the telemetry information includes one or more indicators of power semiconductor device degradation, and wherein the data acquisition and processing unit is configured to determine whether any of the one or more power semiconductor devices has reached a predetermined level of degradation based on the one or more indicators of power semiconductor device degradation included in the telemetry information.

Example 3. The electronic device of example 1 or 2, wherein the telemetry information includes one or more indicators of blocking voltage capability for the one or more power semiconductor devices, and wherein the data acquisition and processing unit is configured to determine whether the blocking voltage capability of any of the one or more power semiconductor devices has dropped below a predetermined level based on the one or more indicators of blocking voltage capability included in the telemetry information.

Example 4. The electronic device of any of examples 1 through 3, wherein the data acquisition and processing unit is configured to calculate a running total of operating cycles for the one or more power semiconductor devices based on the telemetry information, and wherein the data acquisition and processing unit is configured to periodically update the estimate of the remaining lifetime of the one or more power semiconductor devices based on the running total of operating cycles.

Example 5. The electronic device of any of examples 1 through 4, wherein the data acquisition and processing unit is configured to report the most recent estimate of the remaining lifetime of the one or more power semiconductor devices to a controller for the one or more power semiconductor devices and/or an entity having dominion over the controller.

Example 6. The electronic device of any of examples 1 through 5, wherein the data acquisition and processing unit is configured to adjust one or more operating parameters for each of the one or more power semiconductor devices that has reached a predetermined level of degradation as determined by the telemetry information.

Example 7. The electronic device of example 6, wherein the data acquisition and processing unit is configured to reduce a maximum current for each of the one or more power semiconductor devices that has reached the predetermined level of degradation as determined by the telemetry information.

Example 8. The electronic device of example 6 or 7, wherein the data acquisition and processing unit is configured to reduce a maximum temperature for each of the one or more power semiconductor devices that has reached the predetermined level of degradation as determined by the telemetry information.

Example 9. The electronic device of any of examples 6 through 8, wherein the data acquisition and processing unit is configured to reduce a maximum saturation voltage for each of the one or more power semiconductor devices that has reached the predetermined level of degradation as determined by the telemetry information.

Example 10. The electronic device of any of examples 1 through 9, wherein the data acquisition and processing unit is configured to increase a gate voltage above a maximum permitted level for each of the one or more power semiconductor devices having a current slew rate that exceeds a predetermined level as determined by the telemetry information, and wherein the data acquisition and processing unit is configured to subsequently decrease the gate voltage below the maximum permitted level after a predetermined amount of time lapses from when the gate voltage was increased.

Example 11. The electronic device of any of examples 1 through 10, wherein the data acquisition and processing unit is configured to increase a gate voltage above a maximum permitted level for each of the one or more power semiconductor devices having a temperature that exceeds a predetermined level as determined by the telemetry information, and wherein the data acquisition and processing unit is configured to subsequently decrease the gate voltage below the maximum permitted level if the temperature is below the predetermined level after a predetermined amount of time lapses from when the gate voltage was increased.

Example 12. The electronic device of any of examples 1 through 11, wherein the data acquisition and processing unit is configured to store a plurality of operating mode profiles for the one or more power semiconductor devices, and wherein the data acquisition and processing unit is configured to update one or more of the operating mode profiles based on the telemetry information and/or based on information received from a cloud computing resource.

Example 13. The electronic device of example 12, wherein the data acquisition and processing unit is configured to report each of the one or more updated operating mode profiles to a controller for the one or more power semiconductor devices and/or an entity having dominion over the controller.

Example 14. The electronic device of any of examples 1 through 13, wherein the data acquisition and processing unit is configured to modify a model used by the data acquisition and processing unit to estimate the remaining lifetime of the one or more power semiconductor devices, based on information received from a cloud computing resource.

Example 15. An electronic system, comprising: one or more power semiconductor devices configured to drive one or more loads; a gate driver configured to drive the one or more power semiconductor devices; a controller configured to control the gate driver; one or more sensors configured to provide telemetry information for the one or more power semiconductor devices; and a data acquisition and processing unit configured to periodically update an estimate of a remaining lifetime of the one or more power semiconductor devices, based on the telemetry information collected during use of the one or more power semiconductor devices.

Example 16. The electronic system of example 15, wherein the telemetry information includes one or more indicators of power semiconductor device degradation, and wherein the data acquisition and processing unit is configured to determine whether any of the one or more power semiconductor devices has reached a predetermined level of degradation based on the one or more indicators of power semiconductor device degradation included in the telemetry information.

Example 17. The electronic system of example 16, wherein the controller is configured to shift at least some current away from the one or more power semiconductor devices that reached the predetermined level of degradation to one or more of the power semiconductor devices that have not reached the predetermined level of degradation.

Example 18. The electronic system of any of examples 15 through 17, wherein the controller and/or the data acquisition and processing unit is configured to adjust the control of the gate driver based on the estimate of the remaining lifetime of the one or more power semiconductor devices.

Example 19. The electronic system of any of examples 15 through 18, wherein the telemetry information includes one or more indicators of blocking voltage capability for the one or more power semiconductor devices, wherein the data acquisition and processing unit is configured to determine whether the blocking voltage capability of any of the one or more power semiconductor devices has dropped below a predetermined level based on the one or more indicators of blocking voltage capability included in the telemetry information, and wherein the controller and/or the data acquisition and processing unit is configured to adjust the control of the gate driver for each of the one or more power semiconductor devices having a blocking voltage capability below the predetermined level.

Example 20. The electronic system of any of examples 15 through 19, wherein the data acquisition and processing unit is configured to calculate a running total of operating cycles for the one or more power semiconductor devices based on the telemetry information, and wherein the data acquisition and processing unit is configured to periodically update the estimate of the remaining lifetime of the one or more power semiconductor devices based on the running total of operating cycles.

Example 21. The electronic system of any of examples 15 through 20, wherein the data acquisition and processing unit is configured to report the most recent estimate of the remaining lifetime of the one or more power semiconductor devices to the controller, and wherein the controller is configured to adjust the control of the gate driver based on the most recent estimate of the remaining lifetime reported by the data acquisition and processing unit.

Example 22. The electronic system of any of examples 15 through 21, wherein the data acquisition and processing unit is configured to report the most recent estimate of the remaining lifetime of the one or more power semiconductor devices to the controller and/or to an entity having dominion over the controller.

Example 23. The electronic system of any of examples 15 through 22, wherein the controller or the data acquisition and processing unit is configured to adjust one or more operating parameters for each of the one or more power semiconductor devices that has reached a predetermined level of degradation as determined by the telemetry information.

Example 24. The electronic system of example 23, wherein the controller or the data acquisition and processing unit is configured to reduce a maximum current for each of the one or more power semiconductor devices that has reached the predetermined level of degradation as determined by the telemetry information.

Example 25. The electronic system of example 23 or 24, wherein the controller or the data acquisition and processing unit is configured to reduce a maximum temperature for each of the one or more power semiconductor devices that has reached the predetermined level of degradation as determined by the telemetry information.

Example 26. The electronic system of any of examples 23 through 25, wherein the controller or the data acquisition and processing unit is configured to reduce a maximum saturation voltage for each of the one or more power semiconductor devices that has reached the predetermined level of degradation as determined by the telemetry information.

Example 27. The electronic system of any of examples 15 through 26, wherein the controller or the data acquisition and processing unit is configured to increase a gate voltage above a maximum permitted level for each of the one or more power semiconductor devices having a current slew rate that exceeds a predetermined level as determined by the telemetry information, and wherein the controller or the data acquisition and processing unit is configured to subsequently decrease the gate voltage below the maximum permitted level after a predetermined amount of time lapses from when the gate voltage was increased.

Example 28. The electronic system of any of examples 15 through 27, wherein the controller or the data acquisition and processing unit is configured to increase a gate voltage above a maximum permitted level for each of the one or more power semiconductor devices having a temperature that exceeds a predetermined level as determined by the telemetry information, and wherein the controller or the data acquisition and processing unit is configured to subsequently decrease the gate voltage below the maximum permitted level if the temperature is below the predetermined level after a predetermined amount of time lapses from when the gate voltage was increased.

Example 29. The electronic system of any of examples 15 through 28, wherein the data acquisition and processing unit is configured to store a plurality of operating mode profiles for the one or more power semiconductor devices, and wherein the data acquisition and processing unit is configured to update one or more of the operating mode profiles based on the telemetry information and/or based on information received from a cloud computing resource.

Example 30. The electronic system of example 29, wherein the data acquisition and processing unit is configured to report each of the one or more updated operating mode profiles to the controller and/or an entity having dominion over the controller.

Example 31. The electronic system of any of examples 15 through 30, wherein the data acquisition and processing unit is included in the controller or the one or more power semiconductor devices.

Example 32. The electronic system of any of examples 15 through 31, wherein the data acquisition and processing unit is included in a central analysis unit separate from the controller and the one or more power semiconductor devices.

Example 33. The electronic system of any of examples 15 through 32, wherein the data acquisition and processing unit is configured to modify a model used by the data acquisition and processing unit to estimate the remaining lifetime of the one or more power semiconductor devices, based on information received from a cloud computing resource.

Example 34. An electronic device, comprising: an interface configured to receive telemetry information for one or more power semiconductor devices; and a data acquisition and processing unit configured to configured to adjust one or more operating parameters for each of the one or more power semiconductor devices that has reached a predetermined level of degradation as determined by the telemetry information.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device, comprising:
   an interface configured to receive collected telemetry information for one or more power semiconductor devices; and
   a data acquisition and processing unit configured to periodically update an estimate of a remaining lifetime of the one or more power semiconductor devices, based on the telemetry information collected for the one or more power semiconductor devices and received at the interface,
   wherein the data acquisition and processing unit is configured to store a plurality of operating mode profiles for the one or more power semiconductor devices.

2. The electronic device of claim 1, wherein the telemetry information includes one or more indicators of power semiconductor device degradation, and wherein the data acquisition and processing unit is configured to determine whether any of the one or more power semiconductor devices has reached a predetermined level of degradation based on the one or more indicators of power semiconductor device degradation included in the telemetry information.

3. The electronic device of claim 1, wherein the telemetry information includes one or more indicators of blocking voltage capability for the one or more power semiconductor devices, and wherein the data acquisition and processing unit is configured to determine whether the blocking voltage capability of any of the one or more power semiconductor devices has dropped below a predetermined level based on the one or more indicators of blocking voltage capability included in the telemetry information.

4. The electronic device of claim 1, wherein the data acquisition and processing unit is configured to calculate a running total of operating cycles for the one or more power semiconductor devices based on the telemetry information, and wherein the data acquisition and processing unit is configured to periodically update the estimate of the remaining lifetime of the one or more power semiconductor devices based on the running total of operating cycles.

5. The electronic device of claim 1, wherein the data acquisition and processing unit is configured to report a most recent estimate of the remaining lifetime of the one or more power semiconductor devices to a controller for the one or more power semiconductor devices and/or an entity having dominion over the controller.

6. The electronic device of claim 1, wherein the data acquisition and processing unit is configured to adjust one or more operating parameters for each of the one or more power semiconductor devices that has reached a predetermined level of degradation as determined by the telemetry information.

7. The electronic device of claim 6, wherein the data acquisition and processing unit is configured to reduce a maximum current for each of the one or more power semiconductor devices that has reached the predetermined level of degradation as determined by the telemetry information.

8. The electronic device of claim 6, wherein the data acquisition and processing unit is configured to reduce a maximum temperature for each of the one or more power semiconductor devices that has reached the predetermined level of degradation as determined by the telemetry information.

9. The electronic device of claim 6, wherein the data acquisition and processing unit is configured to reduce a maximum saturation voltage for each of the one or more power semiconductor devices that has reached the predetermined level of degradation as determined by the telemetry information.

10. The electronic device of claim 1, wherein the data acquisition and processing unit is configured to increase a gate voltage above a maximum permitted level for each of the one or more power semiconductor devices having a current slew rate that exceeds a predetermined level as determined by the telemetry information, and wherein the data acquisition and processing unit is configured to subsequently decrease the gate voltage below the maximum permitted level after a predetermined amount of time lapses from when the gate voltage was increased.

11. The electronic device of claim 1, wherein the data acquisition and processing unit is configured to increase a gate voltage above a maximum permitted level for each of the one or more power semiconductor devices having a temperature that exceeds a predetermined level as determined by the telemetry information, and wherein the data acquisition and processing unit is configured to subsequently decrease the gate voltage below the maximum permitted level if the temperature is below the predetermined level after a predetermined amount of time lapses from when the gate voltage was increased.

12. The electronic device of claim 1, wherein the data acquisition and processing unit is configured to update one or more of the operating mode profiles based on the telemetry information and/or based on information received from a cloud computing resource.

13. The electronic device of claim 1, wherein the data acquisition and processing unit is configured to modify a model used by the data acquisition and processing unit to estimate the remaining lifetime of the one or more power semiconductor devices, based on information received from a cloud computing resource.

14. An electronic system, comprising:
one or more power semiconductor devices configured to drive one or more loads;
a gate driver configured to drive the one or more power semiconductor devices;
a controller configured to control the gate driver;
one or more sensors configured to provide telemetry information for the one or more power semiconductor devices; and
a data acquisition and processing unit configured to periodically update an estimate of a remaining lifetime of the one or more power semiconductor devices, based on the provided telemetry information for the one or more power semiconductor devices,
wherein the data acquisition and processing unit is configured to store a plurality of operating mode profiles for the one or more power semiconductor devices.

15. The electronic system of claim 14, wherein the telemetry information includes one or more indicators of power semiconductor device degradation, and wherein the data acquisition and processing unit is configured to determine whether any of the one or more power semiconductor devices has reached a predetermined level of degradation based on the one or more indicators of power semiconductor device degradation included in the telemetry information.

16. The electronic system of claim 14, wherein the controller and/or the data acquisition and processing unit is configured to adjust the control of the gate driver based on the estimate of the remaining lifetime of the one or more power semiconductor devices.

17. The electronic system of claim 14, wherein the telemetry information includes one or more indicators of blocking voltage capability for the one or more power semiconductor devices, wherein the data acquisition and processing unit is configured to determine whether the blocking voltage capability of any of the one or more power semiconductor devices has dropped below a predetermined level based on the one or more indicators of blocking voltage capability included in the telemetry information, and wherein the controller and/or the data acquisition and processing unit is configured to adjust the control of the gate driver for each of the one or more power semiconductor devices having a blocking voltage capability below the predetermined level.

18. The electronic system of claim 14, wherein the data acquisition and processing unit is configured to calculate a running total of operating cycles for the one or more power semiconductor devices based on the telemetry information, and wherein the data acquisition and processing unit is configured to periodically update the estimate of the remaining lifetime of the one or more power semiconductor devices based on the running total of operating cycles.

19. The electronic system of claim 14, wherein the data acquisition and processing unit is configured to report a most recent estimate of the remaining lifetime of the one or more power semiconductor devices to the controller and/or to an entity having dominion over the controller.

20. The electronic system of claim 14, wherein the controller or the data acquisition and processing unit is configured to adjust one or more operating parameters for each of the one or more power semiconductor devices that has reached a predetermined level of degradation as determined by the telemetry information.

21. The electronic system of claim 14, wherein the controller or the data acquisition and processing unit is configured to increase a gate voltage above a maximum permitted level for each of the one or more power semiconductor devices having a current slew rate that exceeds a predetermined level as determined by the telemetry information, and wherein the controller or the data acquisition and processing unit is configured to subsequently decrease the gate voltage below the maximum permitted level after a predetermined amount of time lapses from when the gate voltage was increased.

22. The electronic system of claim 14, wherein the controller or the data acquisition and processing unit is configured to increase a gate voltage above a maximum permitted level for each of the one or more power semiconductor devices having a temperature that exceeds a predetermined level as determined by the telemetry information, and wherein the controller or the data acquisition and processing unit is configured to subsequently decrease the gate voltage below the maximum permitted level if the temperature is below the predetermined level after a predetermined amount of time lapses from when the gate voltage was increased.

23. The electronic system of claim 14, wherein the data acquisition and processing unit is configured to update one or more of the operating mode profiles based on the telemetry information and/or based on information received from a cloud computing resource.

24. The electronic system of claim 14, wherein the data acquisition and processing unit is configured to modify a model used by the data acquisition and processing unit to estimate the remaining lifetime of the one or more power semiconductor devices, based on information received from a cloud computing resource.

25. An electronic device, comprising:
an interface configured to receive telemetry information for one or more power semiconductor devices; and
a data acquisition and processing unit configured to configured to adjust one or more operating parameters for each of the one or more power semiconductor devices that has reached a predetermined level of degradation as determined by the telemetry information,
wherein the data acquisition and processing unit is configured to store a plurality of operating mode profiles for the one or more power semiconductor devices.

* * * * *

UNITED STATES PATENT AND TRADEMARK OFFICE
CERTIFICATE OF CORRECTION

PATENT NO. : 11,889,246 B1
APPLICATION NO. : 17/857615
DATED : January 30, 2024
INVENTOR(S) : W. Budde et al.

It is certified that error appears in the above-identified patent and that said Letters Patent is hereby corrected as shown below:

In the Claims

Column 20, Lines 21-22 (Claim 25, Lines 4-5) please change "unit configured to configured to" to
-- unit configured to --

Signed and Sealed this
Nineteenth Day of March, 2024

Katherine Kelly Vidal
*Director of the United States Patent and Trademark Office*